(12) United States Patent
Hwang

(10) Patent No.: US 6,795,288 B2
(45) Date of Patent: Sep. 21, 2004

(54) CIRCUIT FOR ELECTRO STATIC DISCHARGE PROTECTION

(75) Inventor: Seon Ho Hwang, Seoul (KR)

(73) Assignee: LG Electronics Inc., Seoul (KR)

( * ) Notice: Subject to any disclaimer, the term of this patent is extended or adjusted under 35 U.S.C. 154(b) by 190 days.

(21) Appl. No.: 10/124,204

(22) Filed: Apr. 17, 2002

(65) Prior Publication Data

US 2003/0048590 A1 Mar. 13, 2003

(30) Foreign Application Priority Data

Sep. 11, 2001  (KR) .......................................... 2001-55937

(51) Int. Cl.⁷ ............................................... H02H 9/00
(52) U.S. Cl. ....................................... 361/111; 361/91
(58) Field of Search .......................... 361/54, 56, 91, 361/111; 257/355, 357, 360

(56) References Cited

U.S. PATENT DOCUMENTS

| | | | | |
|---|---|---|---|---|
| 5,701,024 A | * | 12/1997 | Watt | ............................. 257/360 |
| 5,859,758 A | * | 1/1999 | Kim | ............................. 361/111 |
| 5,963,409 A | * | 10/1999 | Chang | ............................. 361/56 |
| 6,091,594 A | * | 7/2000 | Williamson et al. | ......... 361/111 |
| 6,411,485 B1 | * | 6/2002 | Chen et al. | ................... 361/111 |
| 6,587,322 B2 | * | 7/2003 | Randazzo | ...................... 361/56 |
| 6,621,673 B2 | * | 9/2003 | Lin et al. | ....................... 361/56 |
| 2002/0021538 A1 | * | 2/2002 | Chen et al. | .................... 361/56 |
| 2002/0105766 A1 | * | 8/2002 | Lin et al. | ....................... 361/56 |

* cited by examiner

Primary Examiner—Jonathan Salata
(74) Attorney, Agent, or Firm—Lee, Hong, Degerman, Kang & Schmadeka

(57) ABSTRACT

A circuit for electro static discharge protection, for solving a problem of conventional art that a degree of integration of the circuit is lowered because a size of chip and a pitch between pads are increased if a high-voltage mos-transistor is used for applying to a high voltage process, comprising: a first pad; a second pad; and a low-voltage nmos-transistor unit connected between the first and second pads, that is, a low-voltage mos-transistor is applied to an electro static discharge protection circuit and a low-voltage mos-transistor which can be used in common is connected to the pads, and thereby, the size of the circuit is reduced to increase a degree of integration and the size of the pad and a pitch between the pads are reduced. Therefore, if the circuit of present invention is applied to a chip having a plurality of pins, then as ize of the chip can be reduced.

7 Claims, 3 Drawing Sheets

CIRCUIT FOR ELECTRO STATIC DISCHARGE PROTECTION

BACKGROUND OF THE INVENTION

1. Field of the Invention

The present invention relates to an electro static discharge protection circuit, and particularly, to an electro static discharge protection circuit which is suitable for reducing a pitch between pads by discharging static electricity using a low-voltage mos-transistor in a circuit using high voltage.

2. Description of the Background Art

Generally, in case of high voltage process higher than 12V used in a field related to a display such as LCD (Liquid Crystal Display), OEL (Organic Electro Luminant), and PDP (Plasma Display Panel), a high voltage mos-transistor is used as a mos-transistor for discharging electro static applied to a pad. The high-voltage mos-transistor like above is larger than a low-voltage mos-transistor, and accordingly, the size of the electro static discharge protection circuit and a chip size are increased. In addition, pitches between pads in the chip including a plurality of pads should be increased, and therefore, it is difficult to construct a circuit.

Hereinafter, the electro static discharge protection circuit using the high-voltage mos-transistor will be described in more detail with reference to accompanying figures.

FIG. 1 is an exemplary circuit diagram of an electro static discharge protection circuit using the high-voltage mos-transistor according to the conventional art, as shown therein, the electro static discharge protection circuit comprises: a first high-voltage pmos-transistor (HCPM1) and a first high-voltage nmos-transistor (HVNM1), in which a drain terminal is connected to a first pad (PAD1) respectively and a source terminal and a gate terminal are commonly connected, respectively; and a second high-voltage pmos-transistor (HVPM2) and a second high-voltage nmos-transistor (HVNM2), in which a drain terminal is connected to a second pad (PAD2), and a source terminal and a gate terminal are commonly connected, respectively.

Herein, the first high-voltage pmos-transistor (HVPM1) and the first high-voltage nmos-transistor (HVNM1) which are commonly connected to the first pad (PAD1) are corresponded to the second high-voltage pmos-transistor (HVPM2) and the second high-voltage nmos-transistor (HVNM2) which are commonly connected to the second pad (PAD2).

An operation of the conventional electro static discharge protection circuit using the high-voltage mos-transistor constructed as above will be described as follows.

When the electro static is applied to the first pad (PAD1), the first high-voltage pmos-transistor (HVPM1) and the first high-voltage nmos-transistor (HVNM1) are turned on to make a current by the high-voltage flow on the two transistors. At that time, the operating states of the first high-voltage pmos-transistor (HVPM1) and of the first high-voltage nmos-transistor (HVNM1) are decided by the size of the voltage which is applied to the first pad (PAD1). That is, the transistor are turned on only when the voltage applied to the first pad (PAD1) is same or larger than a predetermined value.

For example, in case of a system using voltage higher than 12V, an inner circuit is protected by being turned on by the voltage higher than 12V not to make the current by the electro static flow on the inner circuit. That is, the current by the electro static applied through the first high-voltage pmos-transistor (HVPM1) and the first nmos-transistor (HVNM1) is applied to the source terminal and the gate terminal of the second high-voltage pmos-transistor (HVPM2) and of the second high-voltage nmos-transistor (HVNM2), and accordingly, the second high-voltage pmos-transistor (HVPM2) and the second high-voltage nmos-transistor (HVNM2) are turned on. In addition, the current by the electro static is discharged through the second pad (PAD2) to protect the inner circuit.

At that time, the sizes of the respective first and second pmos-transistors (HVPM1 and HVPM2), and of the first and second high-voltage nmos-transistors (HVNM1 and HVNM2) are greatly increased comparing to a low voltage mos-transistor which is generally used, and accordingly, the size of the pad is greatly increased.

However, some display IC (Integrated Circuit) can not use the above pad because it needs a plurality of signal pins.

If a part of the electro static discharge protection circuit is reduced in order to solve the above problem, an immunity of the electro static discharge protection circuit is greatly decreased to harm a reliability of the IC fatally. That is, even the IC performs normal operation, the IC may be disused due to unstable operation of the electro static discharge protection circuit. For example, in case of the high-voltage nmos-transistor used in the electro static discharge protection circuit shown in FIG. 1, the width is 400 μm and the length is 3 μm in 0.6 μm/16V specification, and the width is 500 μm and the length is 3 μm in 0.35 μm/18V specification.

However, in case of low-voltage mos-transistor, the length is 0.6 μm in 0.6/16V specification, and the length is 0.35 μm in 0.35 μm/18V. In addition, the width is also greatly reduced.

FIG. 2 is an exemplary view showing disposition of the pad in the electro static discharge protection circuit according to the conventional art, the area in which the high-voltage mos-transistor constituting the electro static discharge protection circuit is larger than the size of the pads (PAD1 and PAD2), and accordingly, the pitches P between the pads (PAD1 and PAD2) can not be narrowed less than a predetermined distance.

In case that the low-voltage mos-transistor is used in order to solve the problem of the high-voltage mos-transistor, a breakdown voltage of the low-voltage mos-transistor is greatly lowered. Therefore, the low-voltage mos-transistor is not able to function as the electro static discharge protection circuit. In that case, in order to make the low-voltage mos-transistor endure the high breakdown voltage, the circuit should be disposed as shown in FIG. 3.

FIG. 3 is an exemplary view showing a cascade-mos pad using the low-voltage mos-transistor, and the cascade-mos pad comprises a top nmos (LVNM1) and a bottom nmos (LVNM2).

In that case, the size of the transistor is small, however, the area is not greatly reduced because the number of transistors is increased.

As described above, according to the conventional electro static discharge protection circuit, the size of the circuit is increased by using the high-voltage transistor in high-voltage process, and the pitch between pads are increased, and thereby entire degree of integration is lowered.

SUMMARY OF THE INVENTION

Therefore, an object of the present invention is to provide an electro static discharge protection circuit in which an electro static is discharged using a low voltage mos-transistor in a circuit using high voltage, and a pitch between pads can be effectively reduced.

To achieve the object of the present invention, as embodied and broadly described herein, there is provided an electro static discharge protection circuit comprising: a first pad; a second pad; and a low-voltage nmos-transistor unit connected between the first and the second pads.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 4:
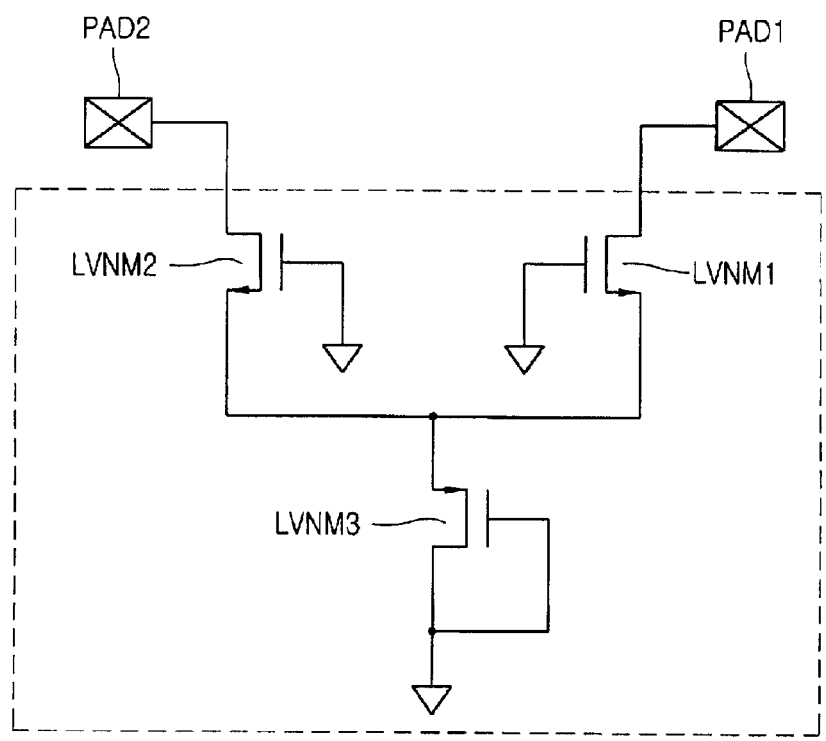
FIG. 4 is an exemplary view showing an electro static discharge protection circuit according to the present invention.

FIG. 4 is an exemplary view showing an electro static discharge protection circuit according to the present invention. As shown therein, the electro static discharge protection circuit comprises: a first pad (PAD1); a second pad (PAD2); and a low-voltage nmos-transistor unit P1 connected between the first and second pads.

An operation of the electro static discharge protection circuit will be described with reference to an electro static test.

There are three methods to test how the circuit is safe for the elector static discharge.

1. a source voltage (Vdd) pin is grounded, after that, the electro static is applied to one pad 2. a ground (GND) pin is grounded, and after that, the electro static is applied to one pad 3. one pad is grounded, and after that, the electro static is applied to the other pad When the third method is used among above test methods, a voltage higher than the breakdown voltage of the high-voltage transistor should be applied to the first pad (PAD1) in order to discharge the current generated by the electro static by generating a current path from the first pad (PAD1) to the second pad (PAD2).

Figure 1:
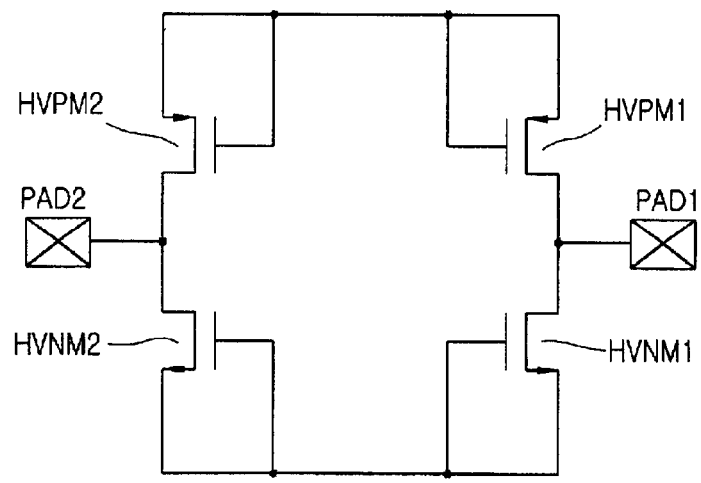
FIG. 1 is an exemplary view showing an electro static discharge protection circuit according to the conventional art.
Figure 2:
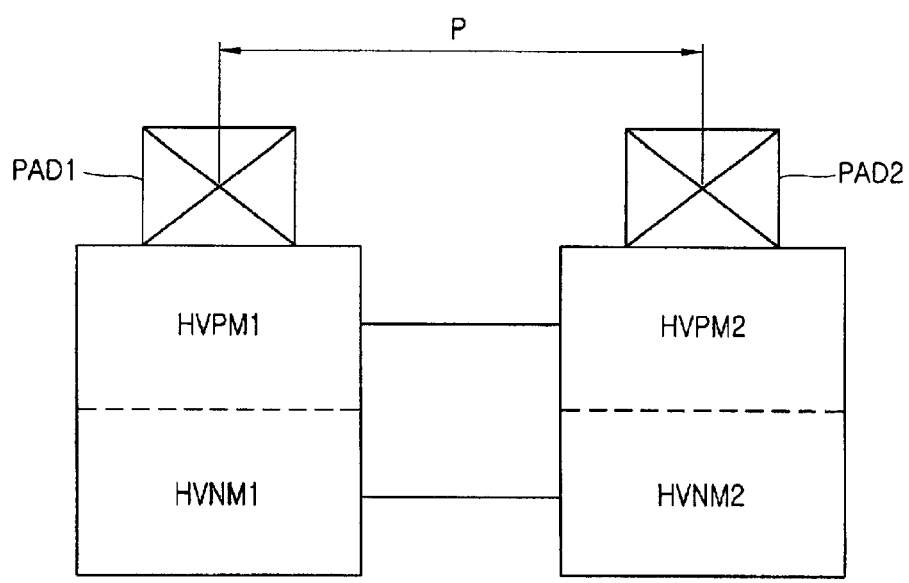
FIG. 2 is an exemplary view showing a disposition of pads in the conventional electro static discharge protection.
Figure 3:
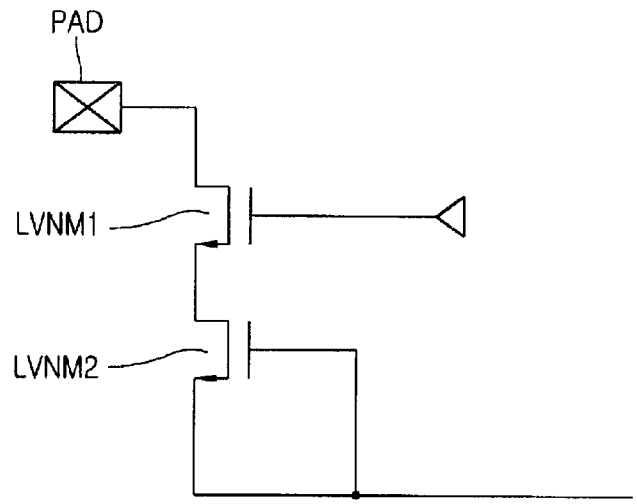
FIG. 3 is an exemplary view showing a cascade-mos pad using a low-voltage mos-transistor.

However, if the high-voltage transistor is used as in the circuit of FIG. 1, the first pad (PAD1) may be damaged due to the large voltage, because the power is same as the value of multiplying current by the voltage.

On the other hand, as shown in FIG. 4, when the voltage larger than the breakdown voltage is applied to the low-voltage transistor, a current path is generated from the first pad (PAD1) to the second pad (PAD2), and thereby the current generated by the electro static can be discharged with much smaller electric power than that of the conventional art. Therefore, the electro static discharge protection circuit according to the present invention is very safe for the electro static.

Hereinafter, detailed operation of the electro static discharge protection circuit for discharging the current generated by the electro static according to the present invention will be described as follows with reference to FIG. 4.

To begin with, in case that the electro static is applied to the first pad (PAD1) after the second pad (PAD2) is grounded, the first low-voltage nmos-transistor (LVNM1) is turned on, and thereby the current generated by the electro static applied to the first pad (PAD1) flows through the first low-voltage nmos-transistor (LVNM1). And the some of the current is discharged through the third low-voltage nmos-transistor (LVNM3) by grounding, and the other current I discharged to the second pad (PAD2) which is grounded through the second low-voltage nmos-transistor (LVNM2).

On the contrary to the above process, in case that the second pad (PAD2) is used as an input terminal after the first pad (PAD1) is grounded, when the electro static is applied to the second pad (PAD2), the first-third low-voltage nmos-transistors (LVNM1, LVNM2, and LVNM3) are all turned on to discharge the current generated by the electro static by grounding.

In addition, in case that the first pad (PAD1) and the second pad (PAD2) are all used as an input terminal and an output terminal, the current generated by the electro static applied to the first pad (PAD1) and to the second pad (PAD2) is discharged through the third low-voltage nmos-transistor (LVNM3). As described above, the mos-transistors are connected to the respective pads (PAD1 and PAD2), and the current applied from the mos-transistor is flowed to the ground by using the mos-transistors commonly, and thereby the size of the electro static discharge protection circuit is greatly reduced. In addition, one low-voltage nmos-transistor can be used commonly to reduce the size of the electro static discharge protection circuit. That is, the electro static discharge protection circuit is constructed as cascade shape. In addition, the upper first and second low-voltage mos-transistors are connected to the first and second pads (PAD1 and PAD2) respectively, and the lower third low-voltage mos-transistor (LVNM3) is used in common to discharge the current generated by the electro current effectively.

Also, in case that the high-voltage mos-transistor is used as in FIG. 1, the current path for discharging the current by grounding is formed only when the voltage higher than the breakdown voltage of the high-voltage mos-transistor is applied to the pad. Therefore, the pad itself may be broken.

However, according to the present invention, the breakdown of the pad can be prevented because the current path is generated by the voltage higher than the breakdown voltage of the low-voltage mos-transistor.

Therefore, the size of the pad can be reduced, and therefore, it is useful for a device using the high voltage, which needs a plurality of pads. According to the present invention, the size of the pad is reduced than that of the conventional art, and it can be used effectively in a device using the high voltage in which many pads should be used.

Figure 5:
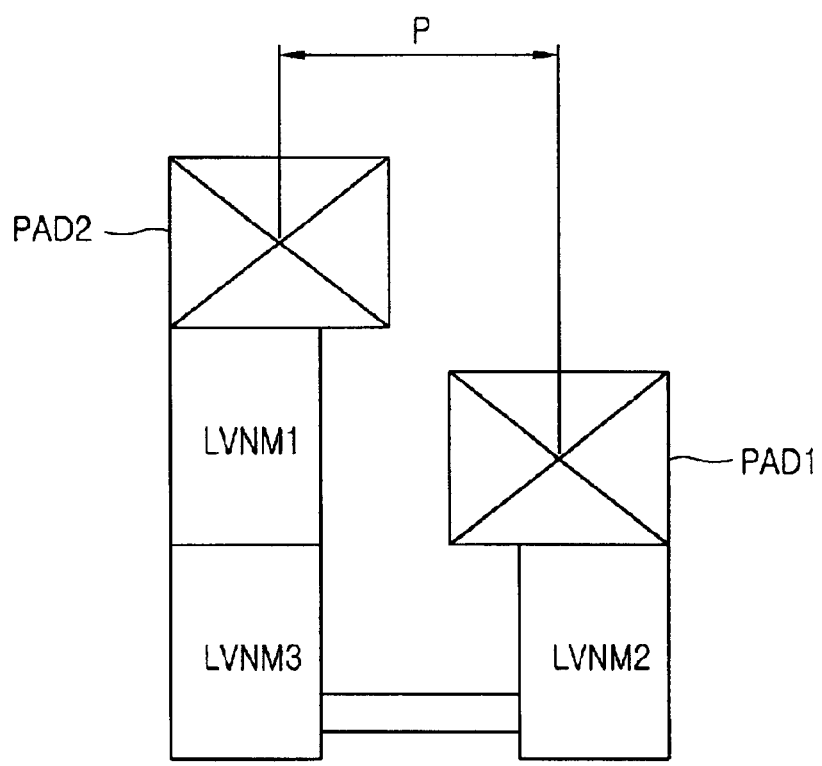
FIG. 5 is an exemplary view showing a disposition of pads in the electro static discharge protection circuit according to the present invention.

FIG. 5 is an exemplary view showing a disposition of pads in the electro static discharge protection circuit according to the present invention. As shown therein, one low-voltage mos-transistor (LVNM3) is shared, and the pads (PAD1 and PAD2) is not contacted to each other, but disposed to be staggered. In addition, the size of the low-voltage mos-transistors (LVNM1~LVNM3) is smaller than the size of the pads (PAD1 and PAD2). Thereby, the pitch (P) between the pads is reduced less than the size of the pads (PAD1 and PAD2).

As described above, the sizes of the pad (PAD1 and PAD2) are reduced and the pitch between the pads (PAD1 and PAD2) is reduced in the present invention. Therefore, if the circuit according to the present invention is applied to a chip having a plurality of pins, then, it is easy to dispose that pins, and the size of the chip can be reduced as small as possible.

According to the electro static discharge protection circuit of the present invention, the low-voltage mos-transistor which is used in common is connected to the pads respectively, and thereby, the size of the electro static discharge protection circuit can be reduced to increase the degree of integration. In addition, the pitch between the pads can be reduced, and therefore, the size of the chip can be reduced if the circuit is applied to the chip having a plurality of pins.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A circuit for electro static discharge protection comprising:
    a first pad;
    a second pad; and
    a low-voltage nmos-transistor unit connected between the first and second pads, the low-voltage nmos-transistor unit comprising first, second and third low-voltage nmos-transistors, wherein the third low-voltage nmos-transistor comprises a drain terminal which is connected to a connecting point of source terminals of first and second low-voltage nmos-transistors, and a gate terminal and a source terminal which are grounded.

2. The circuit of claim 1, wherein the first pad is connected to a drain terminal of a first low-voltage nmos-transistor whose gate terminal is grounded.

3. The circuit of claim 1, wherein the second pad is connected to a drain terminal of a second low-voltage nmos-transistor whose gate terminal is grounded.

4. The circuit of claim 1, wherein the first pad and the second pad are not contacted to each other, and a pitch between the pads is shorter than width of the respective pads.

5. The, circuit of claim 1 wherein the third low-voltage nmos-transistor is connected to the connecting point of source terminals of first and second low-voltage nmos-transistors in order to reduce the pitch between the pads.

6. A circuit for electro static discharge protection comprising:
    a first pad connected to drain terminal of a first low-voltage nmos-transistor having a gate terminal which is grounded;
    a second pad connected to a drain terminal of a second low-voltage nmos-transistor having a gate terminal which is grounded; and
    a low-voltage nmos-transistor unit connected to a connecting point of source terminals of first and second low-voltage nmos-transistors.

7. A circuit for electro static discharge protection comprising:
    a first pad connected to drain terminal of a first low-voltage nmos-transistor having a gate terminal which is grounded;
    a second pad connected to a drain terminal of a second low-voltage nmos-transistor having a gate terminal which is grounded; and
    a third low-voltage nmos-transistor including a drain terminal connected to a connected point of source terminals of the first and second low-voltage nmos-transistors, and a gate terminal and a source terminal which are grounded.

* * * * *